(12) United States Patent
Payne et al.

(10) Patent No.: US 7,242,592 B2
(45) Date of Patent: Jul. 10, 2007

(54) PRINTED CIRCUIT BOARD FOR HIGH SPEED, HIGH DENSITY ELECTRICAL CONNECTOR WITH IMPROVED CROSS-TALK MINIMIZATION, ATTENUATION AND IMPEDANCE MISMATCH CHARACTERISTICS

(75) Inventors: Jason J. Payne, Nashua, NH (US); Mark W. Gailus, Somerville, MA (US); Leon M. Khilchenko, Manchester, NH (US); Huilin Ren, Nashua, NH (US)

(73) Assignee: Amphenol Corporation, Wallingford, CT (US)

( * ) Notice: Subject to any disclaimer, the term of this patent is extended or adjusted under 35 U.S.C. 154(b) by 141 days.

(21) Appl. No.: 10/603,048

(22) Filed: Jun. 24, 2003

(65) Prior Publication Data

US 2004/0264153 A1    Dec. 30, 2004

(51) Int. Cl.
*H05K 1/11* (2006.01)

(52) U.S. Cl. ............... 361/792; 361/793; 361/794; 361/795; 361/790; 174/36; 174/262; 174/263; 174/264; 174/265; 174/266; 174/255; 439/608

(58) Field of Classification Search ............ 174/36, 174/262–266, 255; 361/792–795, 790; 439/608
See application file for complete search history.

(56) References Cited

U.S. PATENT DOCUMENTS

| | | | | |
|---|---|---|---|---|
| 4,859,806 A | * | 8/1989 | Smith | 174/261 |
| 5,331,514 A | * | 7/1994 | Kuroda | 361/760 |
| 5,590,030 A | * | 12/1996 | Kametani et al. | 361/794 |
| 5,784,262 A | * | 7/1998 | Sherman | 361/777 |
| 6,194,668 B1 | * | 2/2001 | Horiuchi et al. | 174/261 |
| 6,232,564 B1 | * | 5/2001 | Arndt et al. | 174/266 |
| 6,293,827 B1 | * | 9/2001 | Stokoe | 439/608 |
| 6,384,341 B1 | * | 5/2002 | Rothermel et al. | 174/255 |
| 6,530,790 B1 | | 3/2003 | McNamara et al. | 439/108 |
| 6,537,087 B2 | * | 3/2003 | McNamara et al. | 439/108 |
| 6,609,933 B2 | * | 8/2003 | Yamasaki | 439/608 |
| 6,787,710 B2 | * | 9/2004 | Uematsu et al. | 174/261 |
| 6,815,621 B2 | * | 11/2004 | Park et al. | 174/260 |
| 2003/0091730 A1 | * | 5/2003 | Jessep et al. | 427/97 |

FOREIGN PATENT DOCUMENTS

WO          03/043138          5/2003

* cited by examiner

*Primary Examiner*—Tuan Dinh
*Assistant Examiner*—Hoa C. Nguyen
(74) *Attorney, Agent, or Firm*—Blank Rome LLP

(57) ABSTRACT

In the preferred embodiment, there is disclosed a printed circuit board having a surface providing a mating interface to which is electrically connected an electrical connector having signal conductors and ground conductors. The printed circuit board includes a plurality of stacked dielectric layers, with a conductor disposed on at least one of the plurality of dielectric layers. The mating interface includes a plurality of conductive vias aligned in a plurality of rows, with the plurality of conductive vias extending through at least a portion of the plurality of dielectric layers, at least one of the plurality of conductive vias intersecting the conductor. The plurality of conductive vias includes signal conductor connecting conductive vias and ground conductor connecting conductive vias. For each of the plurality of rows of the conductive vias, there are at least twice as many ground conductor connecting conductive vias as signal conductor connecting conductive vias and the conductive vias are positioned relative to one another so that for each signal conductor connecting conductive via, there are ground conductor connecting conductive vias adjacent either side of the signal conductor connecting conductive via.

20 Claims, 17 Drawing Sheets

PRINTED CIRCUIT BOARD FOR HIGH SPEED, HIGH DENSITY ELECTRICAL CONNECTOR WITH IMPROVED CROSS-TALK MINIMIZATION, ATTENUATION AND IMPEDANCE MISMATCH CHARACTERISTICS

BACKGROUND OF THE INVENTION

This invention relates generally to an electrical connector assembly for interconnecting printed circuit boards. More specifically, this invention relates to a high speed, high density electrical connector assembly that provides improved cross-talk minimization and improved attenuation and impedance mismatch characteristics.

Electrical connectors are used in many electronic systems. It is generally easier and more cost effective to manufacture a system on several printed circuit boards ("PCBs") which are then connected to one another by electrical connectors. A traditional arrangement for connecting several PCBs is to have one PCB serve as a backplane. Other PCBs, which are called daughter boards or daughter cards, are then connected through the backplane by electrical connectors.

Electronic systems have generally become smaller, faster and functionally more complex. This typically means that the number of circuits in a given area of an electronic system, along with the frequencies at which the circuits operate, have increased significantly in recent years. The systems handle more data and require electrical connectors that are electrically capable of handling the increased bandwidth.

As signal frequencies increase, there is a greater possibility of electrical noise being generated in the connector in forms such as reflections, cross-talk and electromagnetic radiation. Therefore, the electrical connectors are designed to control cross-talk between different signal paths, and to control the characteristic impedance of each signal path. In order to reduce signal reflections in a typical module, the characteristic impedance of a signal path is generally determined by the distance between the signal conductor for this path and associated ground conductors, as well as both the cross-sectional dimensions of the signal conductor and the effective dielectric constant of the insulating materials located between these signal and ground conductors.

Cross-talk between distinct signal paths can be controlled by arranging the various signal paths so that they are spaced further from each other and nearer to a shield plate, which is generally the ground plate. Thus, the different signal paths tend to electromagnetically couple more to the ground conductor path, and less with each other. For a given level of cross-talk, the signal paths can be placed closer together when sufficient electromagnetic coupling to the ground conductors are maintained.

Electrical connectors can be designed for single-ended signals as well as for differential signals. A single-ended signal is carried on a single signal conducting path, with the voltage relative to a common ground reference set of conductors being the signal. For this reason, single-ended signal paths are very sensitive to any common-mode noise present on the common reference conductors. It has thus been recognized that this presents a significant limitation on single-ended signal use for systems with growing numbers of higher frequency signal paths.

Differential signals are signals represented by a pair of conducting paths, called a "differential pair." The voltage difference between the conductive paths represents the signal. In general, the two conducing paths of a differential pair are arranged to run near each other. If any other source of electrical noise is electromagnetically coupled to the differential pair, the effect on each conducting path of the pair should be similar. Because the signal on the differential pair is treated as the difference between the voltages on the two conducting paths, a common noise voltage that is coupled to both conducting paths in the differential pair does not affect the signal. This renders a differential pair less sensitive to cross-talk noise, as compared with a single-ended signal path.

One example of a differential pair electrical connector is shown in U.S. Pat. No. 6,293,827 ("the '827 patent"), which is assigned to the assignee of the present application. The '827 patent is incorporated by reference herein. The '827 patent discloses a differential signal electrical connector that generally utilizes individual shields corresponding to each pair of differential signals to provide shielding.

While the electrical connector disclosed in the '827 patent and other presently available differential pair electrical connector designs provide generally satisfactory performance, the inventors of the present invention have noted that at high speeds (for example, signal frequency of 3 GHz or greater), the presently available electrical connector designs may not sufficiently provide desired minimal cross-talk, impedance and attenuation mismatch characteristics.

These problems of cross-talk, impedance and attenuation mismatch are more significant when the electrical connector utilizes single-ended signals, rather than differential signals.

What is desired, therefore, is a high speed, high density electrical connector design that provides improved cross-talk minimization, impedance and attenuation control regardless of whether the connector utilizes single-ended signals or differential signals. Further, what is desired is a printed circuit board for such high speed, high density electrical connector design.

SUMMARY OF THE INVENTION

In the preferred embodiment, there is disclosed a printed circuit board having a surface providing a mating interface to which is electrically connected an electrical connector having signal conductors and ground conductors. The printed circuit board includes a plurality of stacked dielectric layers, with a conductor disposed on at least one of the plurality of dielectric layers. The mating interface includes a plurality of conductive vias aligned in a plurality of rows, with the plurality of conductive vias extending through at least a portion of the plurality of dielectric layers, at least one of the plurality of conductive vias intersecting the conductor. The plurality of conductive vias includes signal conductor connecting conductive vias and ground conductor connecting conductive vias. For each of the plurality of rows of the conductive vias, there are at least twice as many ground conductor connecting conductive vias as signal conductor connecting conductive vias and the conductive vias are positioned relative to one another so that for each signal conductor connecting conductive via, there are ground conductor connecting conductive vias adjacent either side of the signal conductor connecting conductive via.

BRIEF DESCRIPTION OF THE DRAWINGS

The foregoing features of this invention, as well as the invention itself, may be more fully understood from the following description of the drawings in which:

FIG. 5b is a perspective view of the shield strips of FIG. 5a;

DETAILED DESCRIPTION OF THE INVENTION

Figure 1:
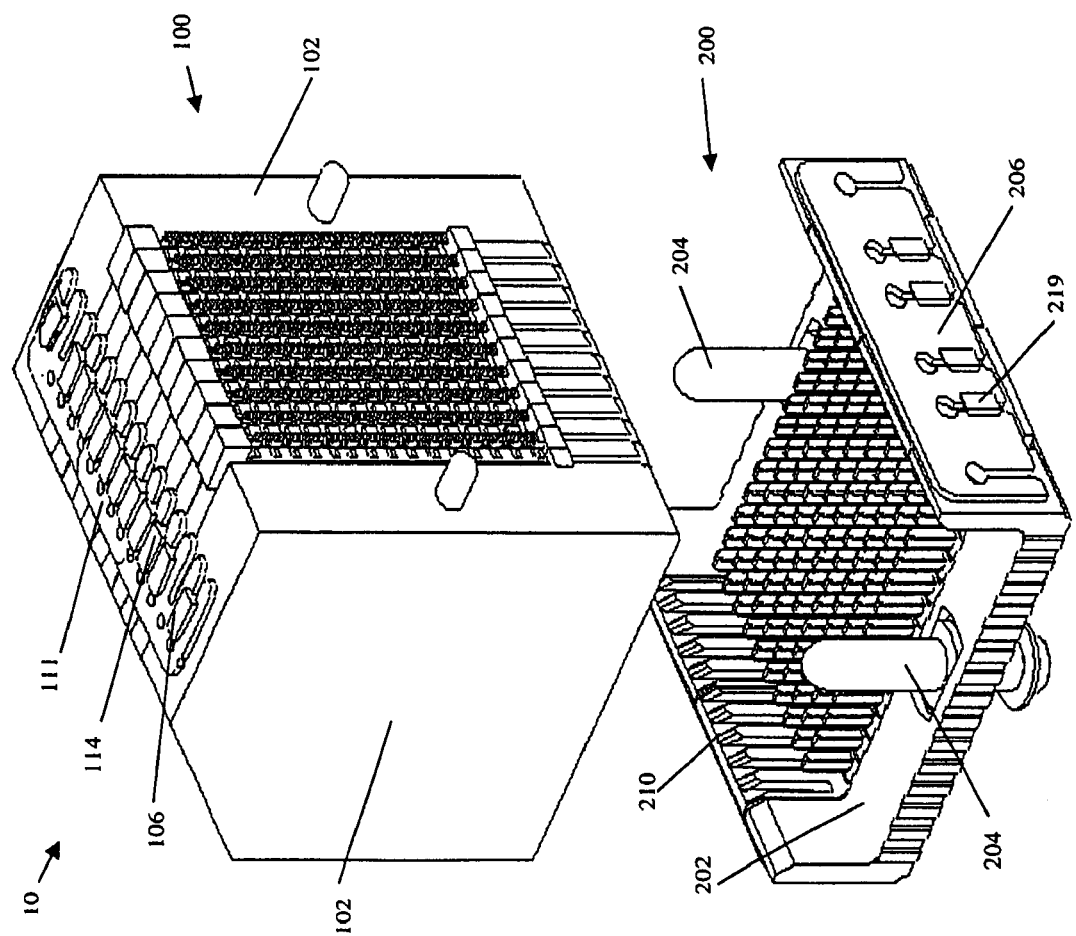
FIG. 1 is a perspective view of an electrical connector assembly of the present invention showing a first electrical connector about to mate with a second electrical connector.
Figure 2:
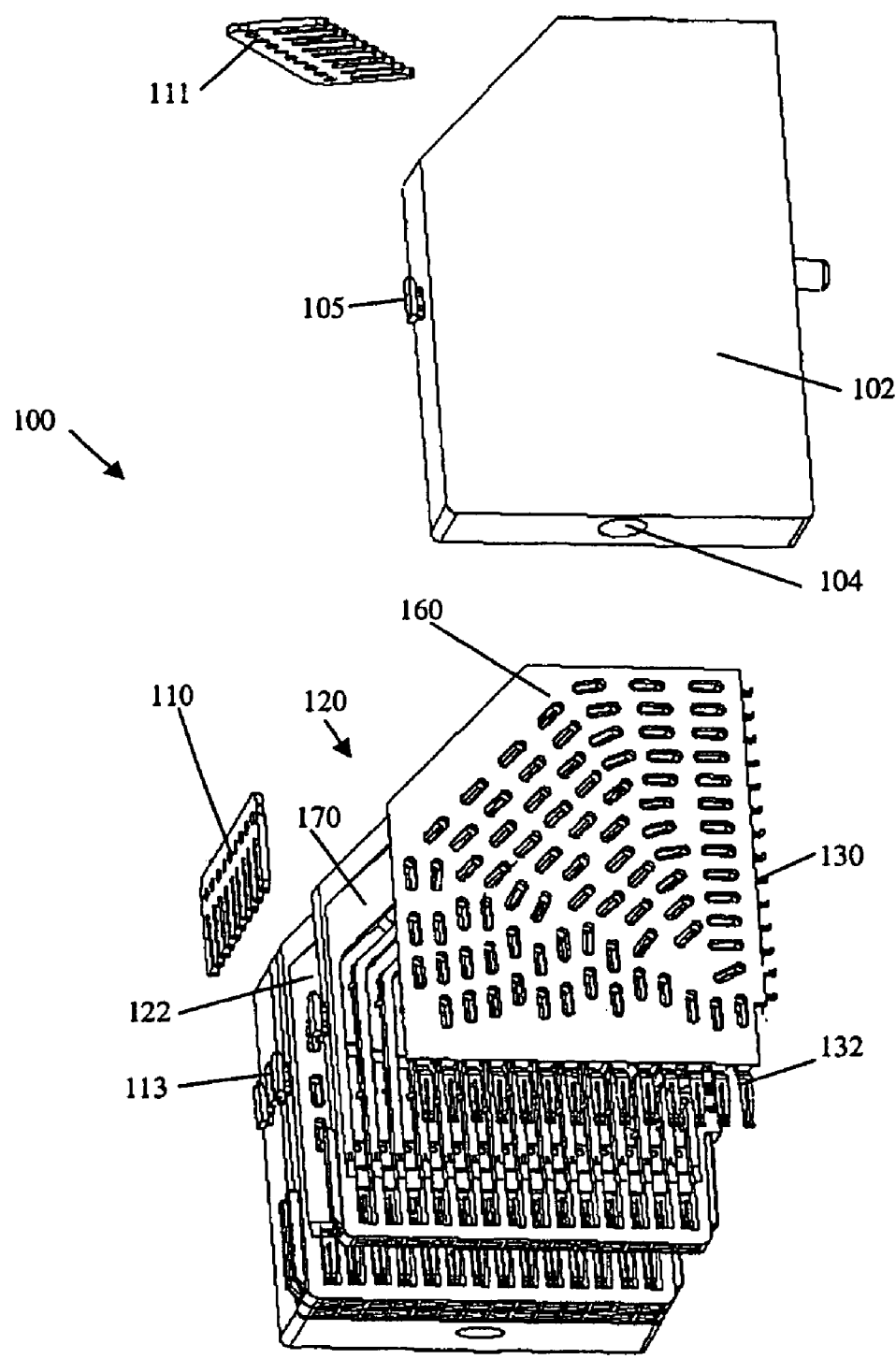
FIG. 2 is an exploded view of the first electrical connector of FIG. 1, showing a plurality of wafers.

Referring to FIG. 1, there is shown an electrical connector assembly in accordance with an embodiment of the present invention. The electrical connector assembly 10 includes a first electrical connector 100 mateable to a second electrical connector 200.

Figure 3:
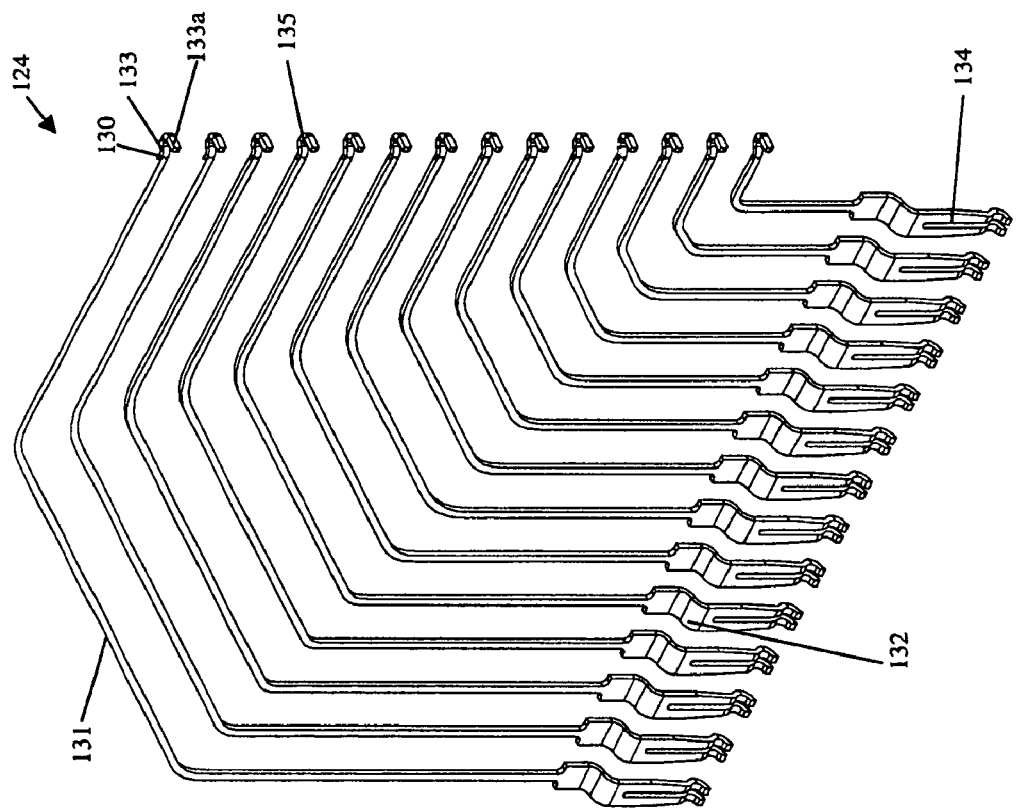
FIG. 3 is a perspective view of signal conductors of one of the wafers of the first electrical connector of FIG. 2.
Figure 4:
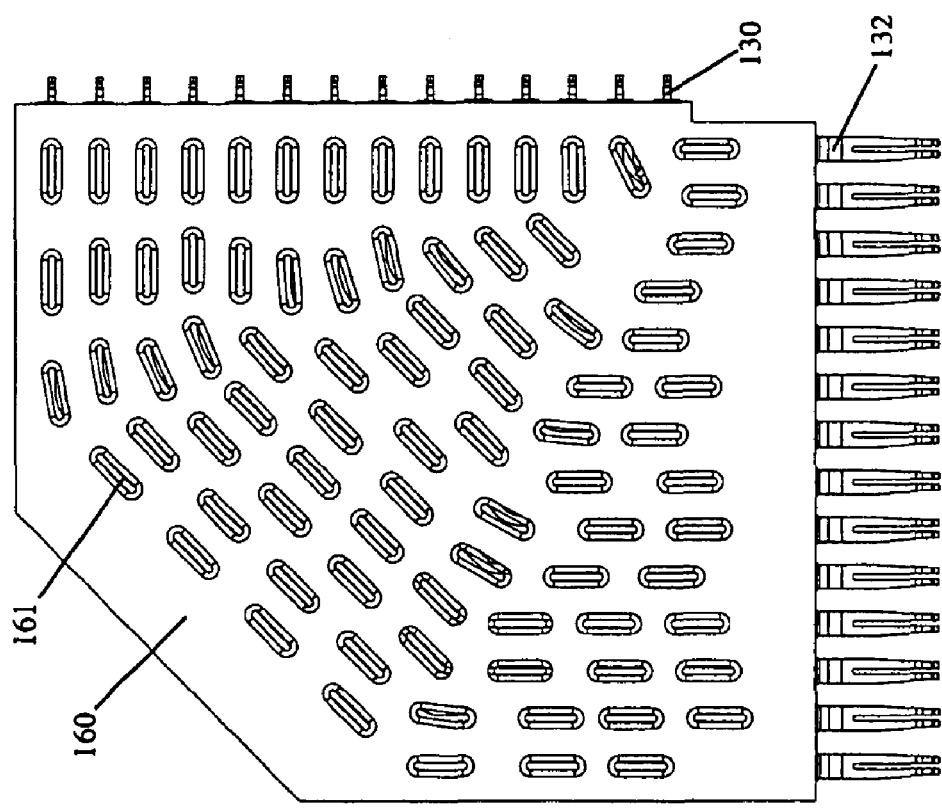
FIG. 4 is a side view of the signal conductors of FIG. 3 with an insulative housing formed around the signal conductors.
Figure 5B:
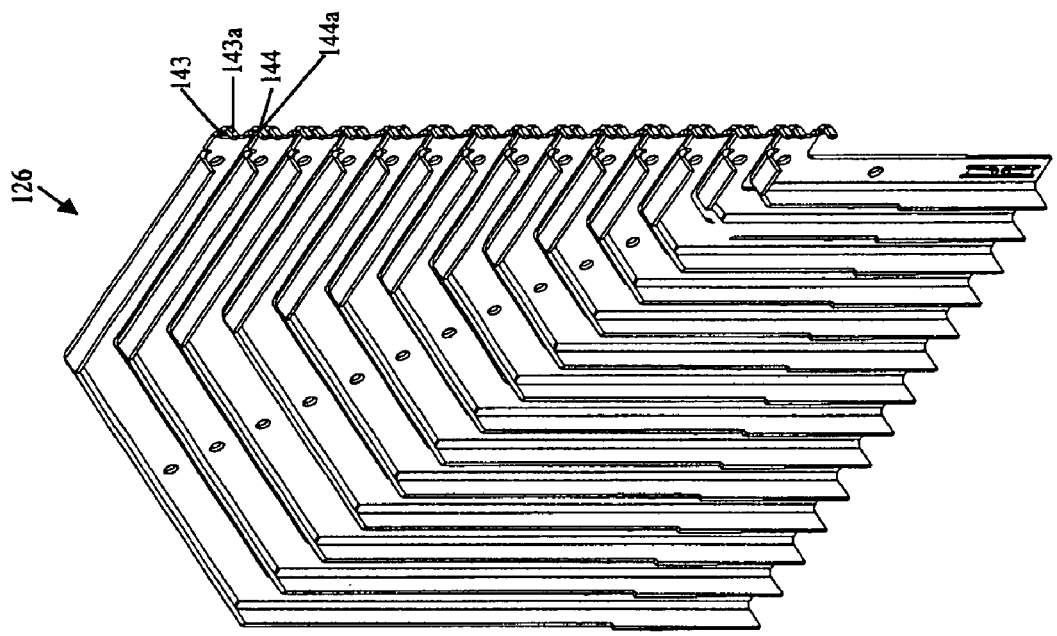
Figure 5A:
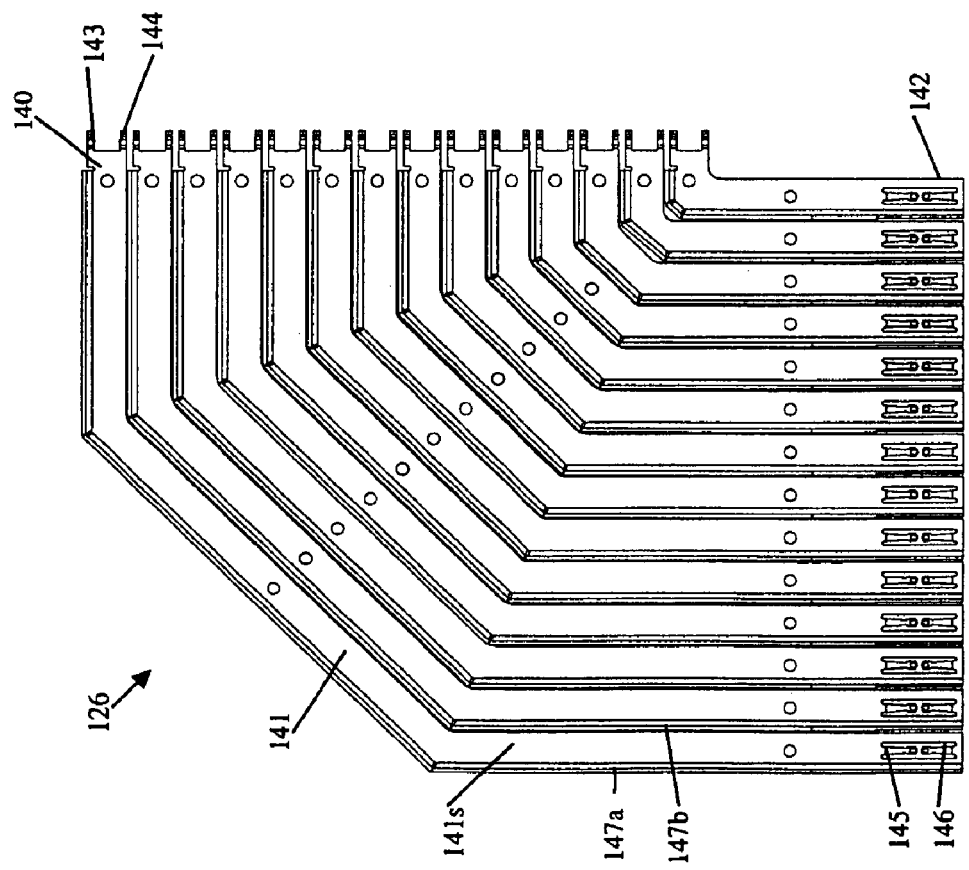
FIG. 5a is a side view of shield strips of one of the wafers of the first electrical connector of FIG. 2.

The first electrical connector 100, which is shown in greater detail in FIGS. 2–8b, includes a plurality of wafers 120, with each of the plurality of wafers 120 having an insulative housing 122, a plurality of signal conductors 124 (see FIG. 3) and a plurality of shield strips 126 (see FIGS. 5a and 5b). For exemplary purposes only, the first electrical connector 100 is illustrated with ten wafers 120, with each wafer 120 having fourteen single-ended signal conductors 124 and corresponding fourteen shield strips 126. However, as it will become apparent later, the number of wafers and the number of signal conductors and shield strips in each wafer may be varied as desired.

The first electrical connector 100 is also shown having side walls 102 on either end, with each side wall 102 having an opening 104 for receiving a guide pin (which may also be referred to as a corresponding rod) 204 of a side wall 202 of the second electrical connector 200. Each side wall 102 further includes features 105, 106 to engage slots in stiffeners 110, 111, respectively. Likewise, the insulative housing 122 of each wafer 120 provides features 113, 114 to engage the slots in stiffeners 110, 111, respectively.

Figure 14:
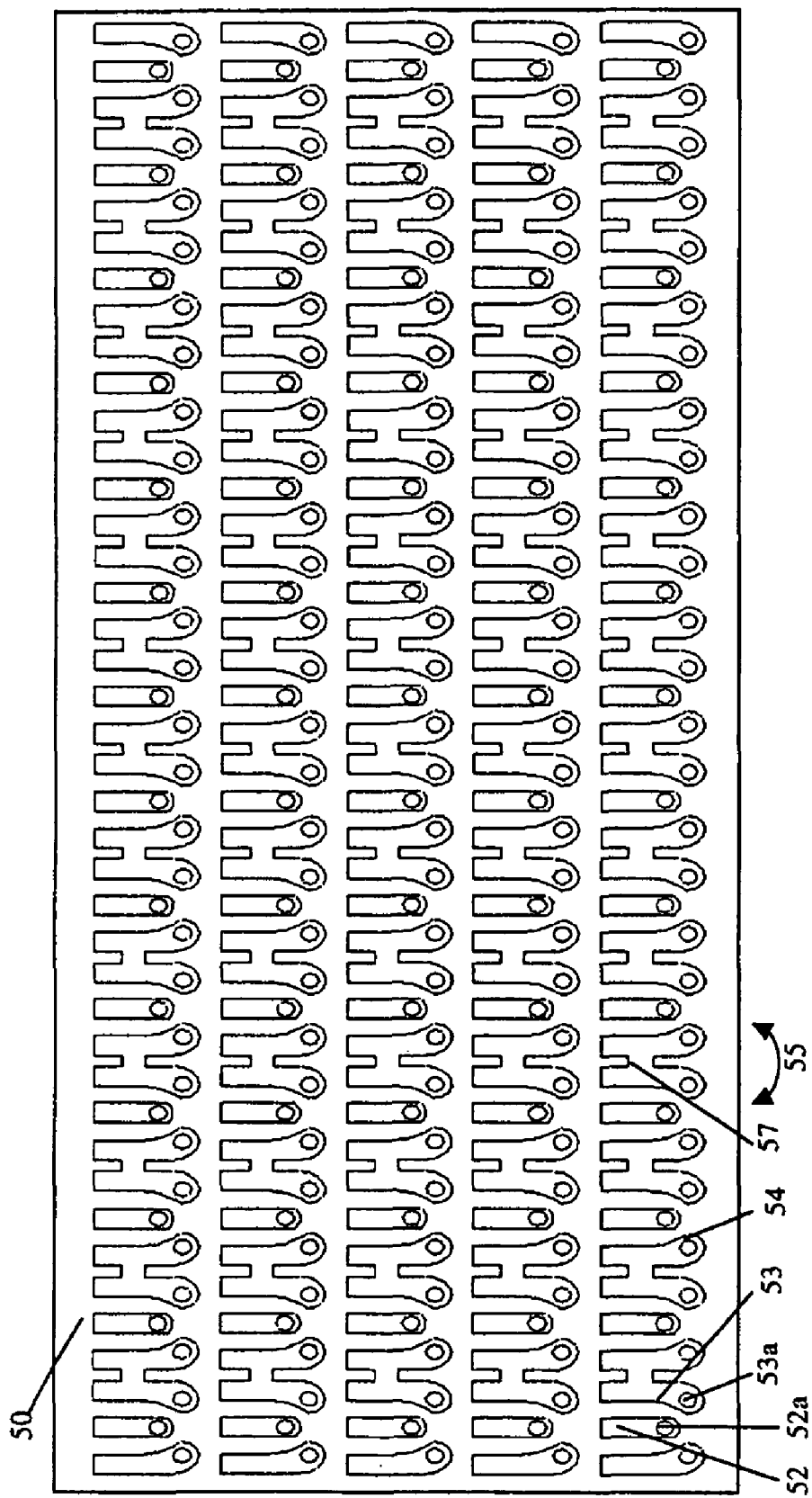
FIG. 14 is a top view of a portion of a printed circuit board to which an electrical connector in accordance with the present invention, such as the first electrical connector and/or the second electrical connector of FIG. 1, can be connected.

Each signal conductor 124 has a first contact end 130 connectable to a printed circuit board, such as the printed circuit board 50 shown in part in FIG. 14, a second contact end 132 connectable to the second electrical connector 200, and an intermediate portion 131 therebetween. Each shield strip 126 has a first contact end 140 connectable to the printed circuit board, such as the printed circuit board 50 shown in part in FIG. 14, a second contact end 142 connectable to the second electrical connector 200, and an intermediate portion 141 therebetween.

In the embodiment of the invention illustrated in FIGS. 1–8b, the first contact end 130 of the signal conductors 124 includes a contact tail 133 having a contact pad 133a that is adapted for soldering to the printed circuit board. The second contact end 132 of the signal conductors 124 includes a dual beam structure 134 configured to mate to a corresponding mating structure of the second electrical connector 200, to be described below. The first contact end 140 of the shield strips 126 includes at least two contact tails 143, 144 having contact pads 143a, 144a, respectively, that are adapted for soldering to the printed circuit board. The second contact end 142 of the shield strips 126 includes opposing contacting members 145, 146 that are configured to provide a predetermined amount of flexibility when mating to a corresponding structure of the second electrical connector 200. While the drawings show contact tails adapted for soldering, it should be apparent to one of ordinary skill in the art that the first contact end 130 of the signal conductors 124 and the first contact end 140 of the shield strips 126 may take any known form (e.g., press-fit contacts, pressure-mount contacts, paste-in-hole solder attachment) for connecting to a printed circuit board.

Still referring to FIGS. 5a and 5b, the intermediate portion 141 of each shield strip 126 has a surface 141s with a first edge 147a and a second edge 147b, at least one of the first edge 147a or the second edge 147b being bent. In the preferred embodiment, the first edge 147a is bent substantially perpendicular to the surface 141s of the shield strip 126 and extends through to the end of the second contact end 142 (but not through to the end of the first contact end 140). As will be described in greater detail below, the design of the shield strips 126 is significant in addressing the problems of cross-talk, impedance and attenuation mismatch set forth in the Background of the Invention section.

FIG. 4 is a side view of the signal conductors 124 of FIG. 3, with the signal conductors 124 disposed in a first insulative housing portion 160. Preferably, the first insulative housing portion 160 is formed around the signal conductors 124 by injection molding plastic. To facilitate this process, the signal conductors 124 are preferably held together on a lead frame (not shown) as known in the art. Although not required, the first insulative housing portion 160 may be provided with windows 161 adjacent the signal conductors 124. These windows 161 are intended to generally serve two purposes: (i) ensure during injection molding process that the signal conductors 124 are properly positioned, and (ii) impedance control to achieve desired impedance characteristics.

Figure 7:
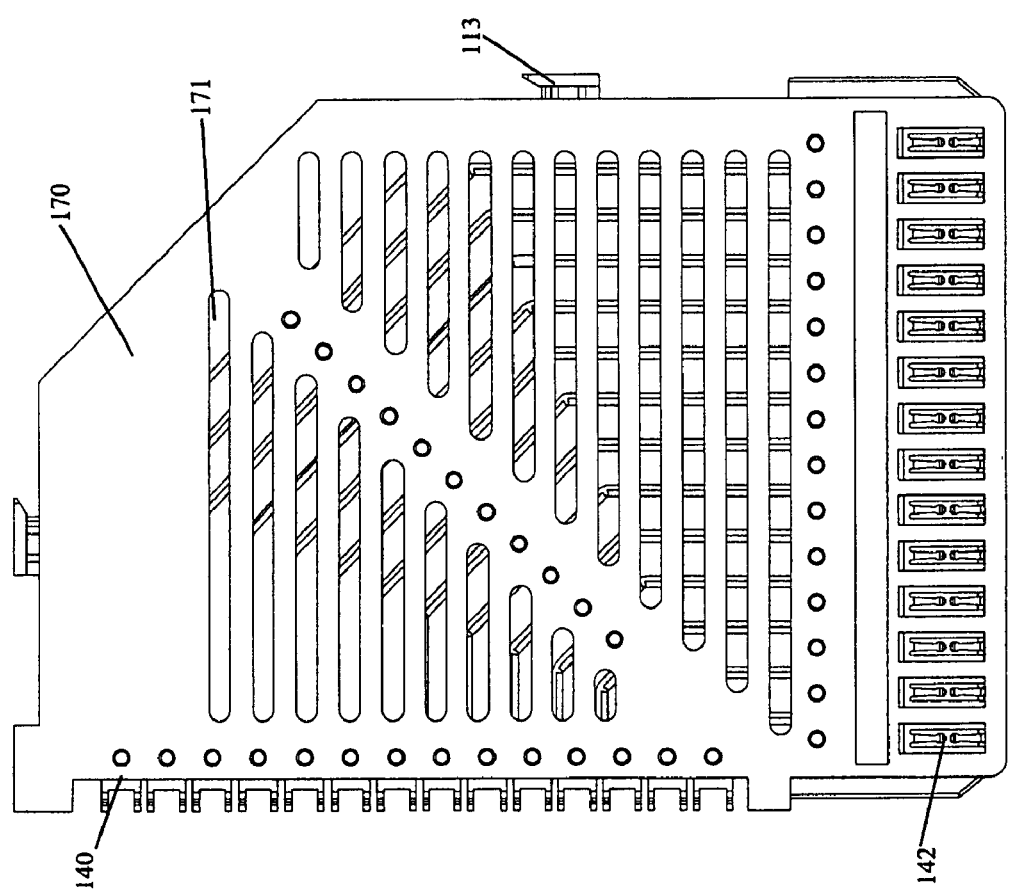
FIG. 7 is a side view of the shield strips of FIG. 5a with an insulative housing formed around the shield strips.

FIG. 7 is a side view of the shield strips 126 of FIGS. 5a and 5b, with the shield strips 126 disposed in a second insulative housing portion 170. Whereas the second contact ends 132 of the signal conductors 124 are not disposed in the first insulative housing portion 160, the second contact ends 142 of the shield strips 126 are preferably disposed in the second insulative housing portion 170. Also, the second insulative housing portion 170 around the second contact ends 142 of the shield strips 126 is configured so as to be able to receive the second contact ends 132 of the signal conductors 124 when the first and the second insulative housing portions 160, 170 are attached together to form a wafer 120.

Preferably, the second insulative housing portion 170 is formed around the shield strips 126 by injection molding plastic. Note that although not required, the second insulative housing portion 170 may be provided with windows 171 adjacent the shield strips 126. These windows 171 are intended to ensure during the injection molding process that the shield strips 126 are properly positioned.

Figure 6:
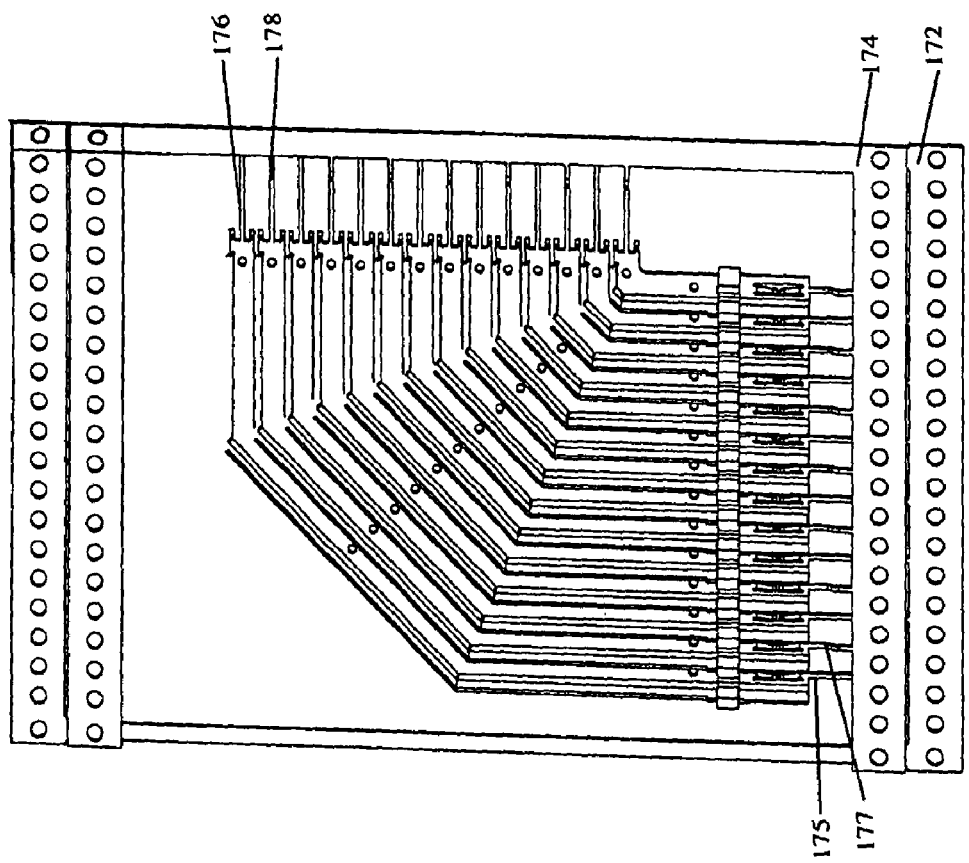
FIG. 6 is a side view of the shield strips of FIG. 5a formed on two lead frames, with each lead frame holding half of the shield strips.

To facilitate the injection molding process, the shield strips 126 are preferably held together on two lead frames 172, 174, as shown in FIG. 6. Each lead frame 172, 174 holds every other of the plurality of the shield strips 126, so when the lead frames 172, 174 are placed together, the shield strips 126 will be aligned as shown in FIGS. 5a and 5b. In the embodiment shown, each lead frame 172, 174 holds a total of seven shield strips 126.

The reason for utilizing two lead frames relates to easing manufacturability. As discussed above in connection with FIGS. 5a and 5b, each shield strip 126 has the surface 141s with the first edge 147a and the second edge 147b, at least one of which is bent. Because of the need to place the shield strips 126 closely adjacent one another as shown in FIGS. 5a and 5b (in the preferred embodiment, each shield strip 126 is electrically isolated from its adjacent shield strips by a layer of plastic when the second insulative housing portion 170 is formed around the shield strips 126; however, the shield strips 126 of each wafer 120 may also be electrically connected to one another), and the requirement for having a bent edge 147a, 147b, it is thus required to use at least two lead frames 172, 174 during the manufacturing process.

The lead frame 172 includes tie bars 175 which connect to the second contact ends 142 of its respective shield strips 126 and tie bars 176 which connect to the first contact ends 140 of the shield strips 126. The lead frame 174 includes tie bars 177 which connect to the second contact ends 142 of its respective shield strips 126 and tie bars 178 which connect to the first contact ends 140 of the shield strips 126. These tie bars 175–178 are cut during subsequent manufacturing processes.

Note that the first insulative housing portion 160 includes attachment features (not shown) and the second insulative housing portion 170 includes attachment features (not shown) that correspond to the attachment features of the first insulative housing portion 160 for attachment thereto. Such attachment features may include protrusions and corresponding receiving openings. Other attachment features as known in the art may also be utilized.

Figure 8B:
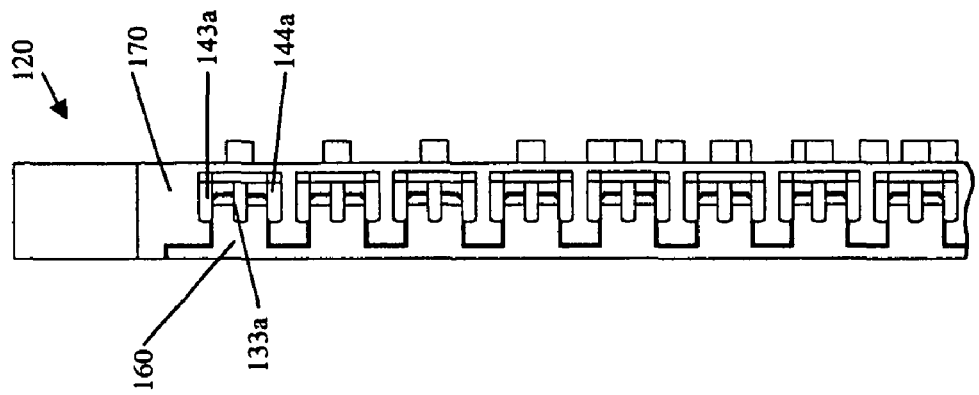
FIG. 8b is a front view of a portion of the assembled wafer of FIG. 8a, showing first contact ends of the signal conductors and the shield strips configured for connection to a printed circuit board.
Figure 8A:
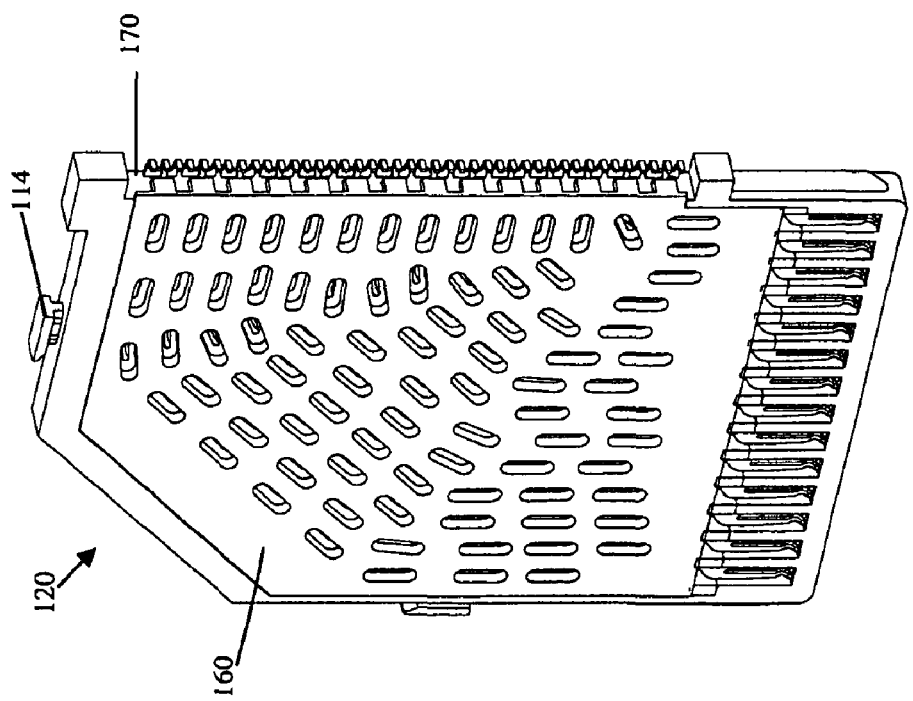
FIG. 8a is a perspective view of an assembled one of the wafers of the first electrical connector of FIG. 2.

When the first insulative housing portion 160 and the second insulative housing portion 170 are attached together to form a wafer 120 as shown in FIGS. 8a and 8b, each signal conductor 124 is positioned along the surface 141s adjacent its corresponding shield strip 126. And the bent edge 147a, 147b of the surface 141s is directed toward the corresponding signal conductor 124. In the embodiment of the invention shown, the contact pads 133a of the signal conductors 124 and the contact pads 143a, 144a of the shield strips 126 are aligned along a line for attachment to a printed circuit board, such as the printed circuit board 50 of FIG. 14. One way to provide alignment of the contact pads 133a, 143a, 144a along a line is to provide the first contact ends 130 of the signal conductors 124 with a curved portion 135 (see FIG. 3) having a predetermined curvature. Note that the first contact ends 140 of the shield strips 126 may also be provided with a curved portion having a predetermined curvature.

The first electrical connector 100 may also be configured to carry differential pairs of signals. In this case, a second plurality of signal conductors is preferably provided to each of the plurality of wafers 120. And the surface 141s of each shield strip is preferably wider than a distance between the signals of a corresponding differential pair to provide sufficient shielding.

Figure 9:
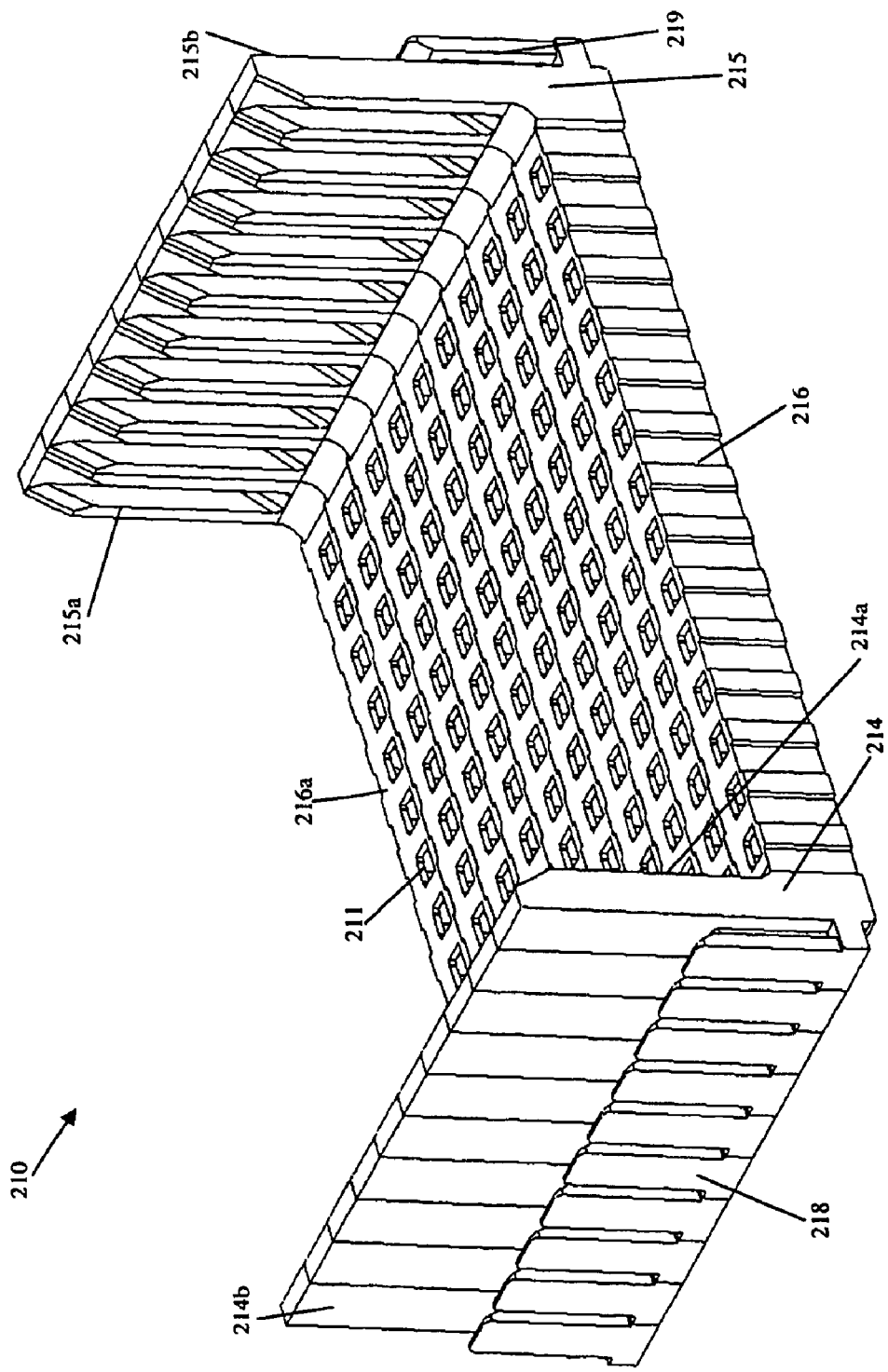
FIG. 9 is a perspective view of insulative housing of the second electrical connector of FIG. 1.

Referring now to FIG. 9, there is shown a perspective view of an insulative housing 210 of the second electrical connector 200 of FIG. 1. The insulative housing 210 has a first end wall 214 with an inner surface 214a and an outer surface 214b, a second end wall 215 with an inner surface 215a and an outer surface 215b, and a base 216. The inner surfaces 214a, 215a of the first and second end walls 214, 215, respectively, define grooves for receiving the wafers 120 of the first electrical connector 100. The outer surfaces 214b, 215b of the first and second end walls 214, 215, respectively, define features 218, 219 to engage slots in stiffeners 206 (only one of which is shown in FIG. 1).

Figure 10:
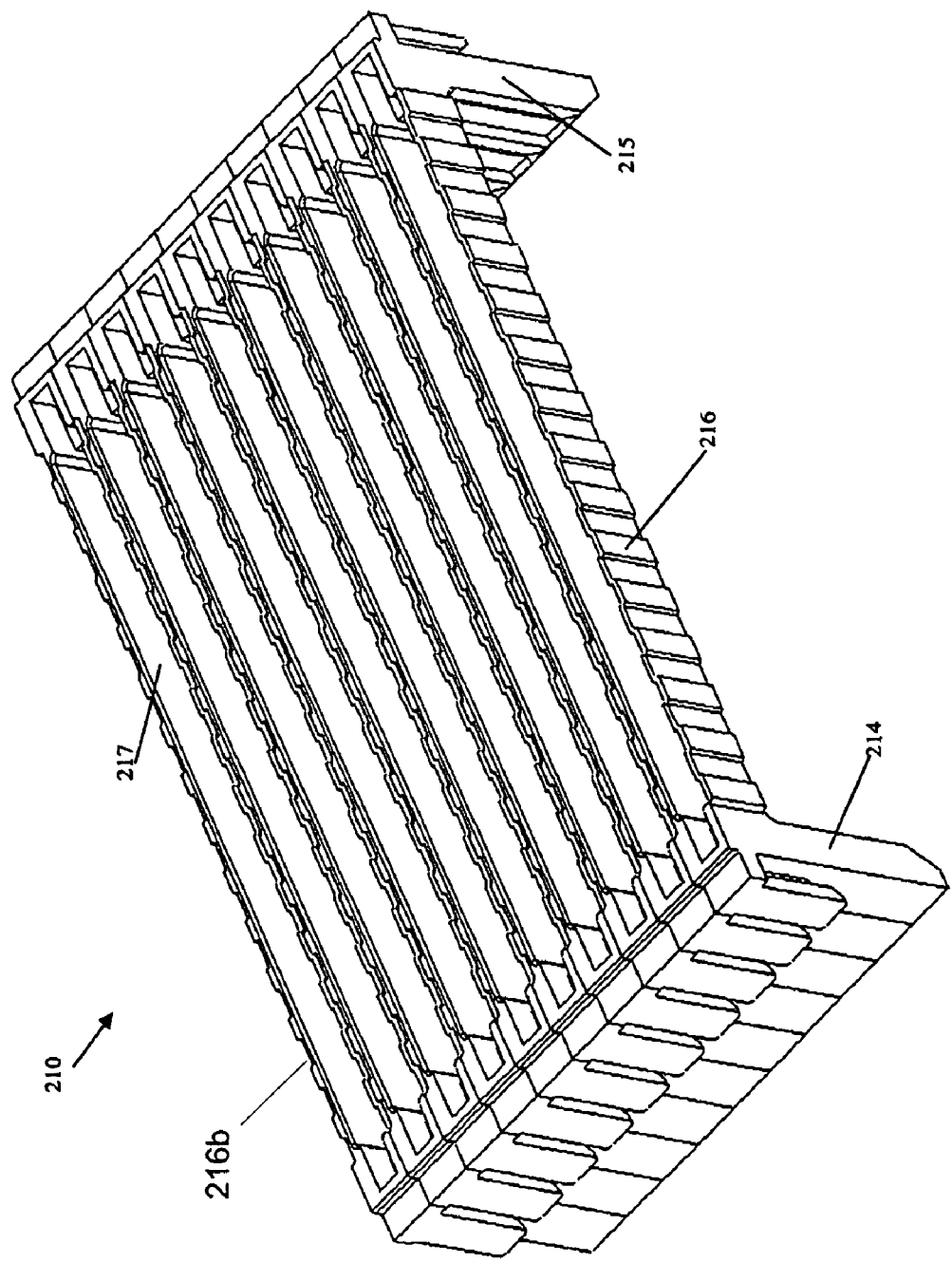
FIG. 10 is a bottom view of the insulative housing of FIG. 9.

The base 216 of the insulative housing 210 has a top surface 216a with a plurality of openings 211 and a bottom surface 216b with a plurality of slots 217 (see FIG. 10). As will be described hereinafter, the slots 217 and the openings 211 are configured to receive a plurality of signal conductors 240 and ground conductors 250 disposed on insulative posts 230 of the second electrical connector 200. While the insulative housing 210 shown in FIGS. 9 and 10 has ten grooves for receiving the wafers 120 and ten slots 217 for receiving signal conductors 240 and ground conductors 250 disposed on insulative posts 230, the insulative housing may be designed to provide any number of grooves and slots as desired. This design flexibility provides modularity of the present invention connector solution.

Figure 11:
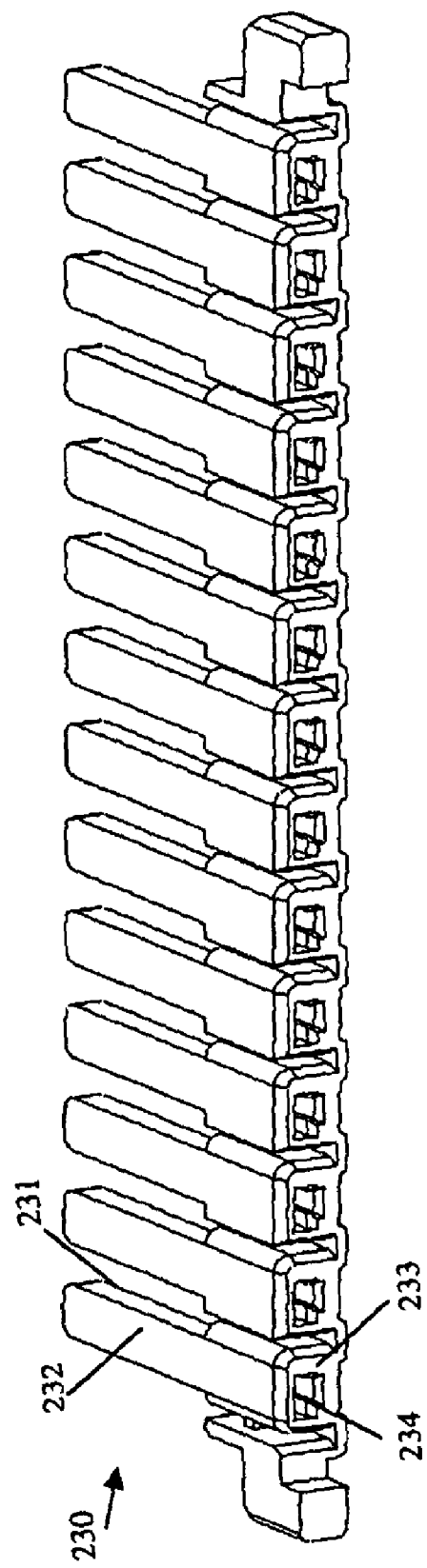
FIG. 11 is a perspective view of a row of insulative posts disposable in the insulative housing of FIG. 9.

FIG. 11 shows a row of the insulative posts 230, with each insulative post 230 having a first side 231 and a second side 232. Each of the first side 231 and the second side 232 may be provided with a groove. Preferably, the insulative posts 230 of the row are attached to one another, as shown. This can be done during the molding process or by other methods known in the art. Each insulative post 230 also has a hole 234 on a bottom surface 233, through which the signal conductor 240 is inserted. Note that in an alternative embodiment (not shown), the insulative posts 230 may be formed around the signal conductors 240 by injection molding plastic.

Figure 12B:
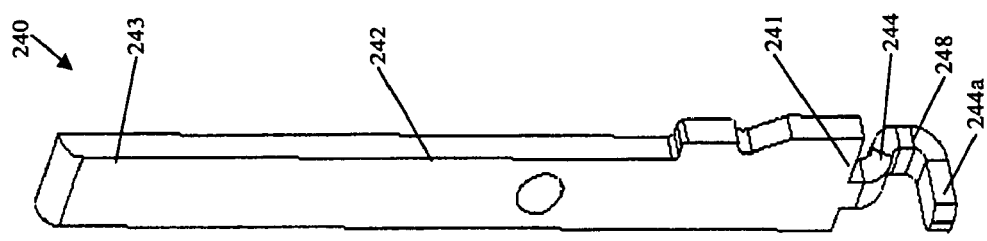
FIG. 12b is a perspective view of a signal conductor of the second electrical connector of FIG. 1.

Each signal conductor 240, as shown in FIG. 12b, has a first contact end 241 connectable to a printed circuit board, such as the printed circuit board 50 shown in part in FIG. 14, a second contact end 243 connectable to the second contact end 132 of the corresponding signal conductor 124 of the first electrical connector 100, and an intermediate portion 242 therebetween. Each ground conductor 250, as shown in FIG. 12a, has a first contact end 251 connectable to a printed circuit board, such as the printed circuit board 50 shown in part in FIG. 14, a second contact end 253 connectable to the second contact end 142 of the corresponding shield strip 126 of the first electrical connector 100, and an intermediate portion 252 therebetween.

Figure 12A:
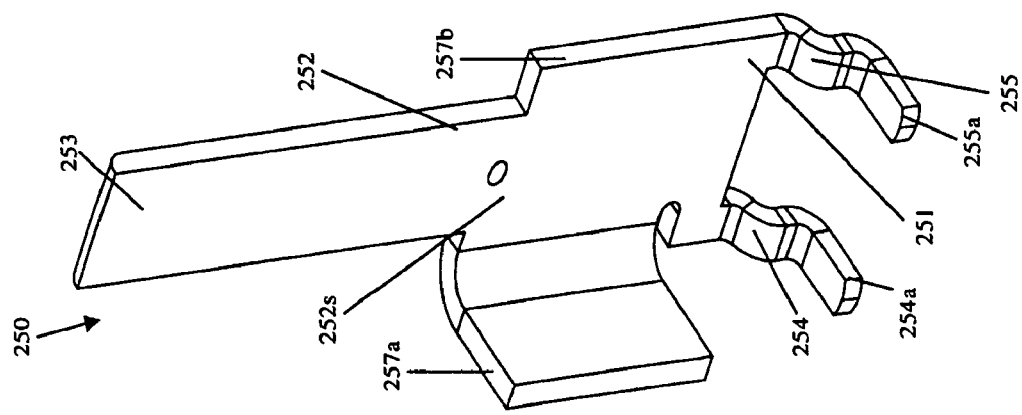
FIG. 12a is a perspective view of a ground conductor of the second electrical connector of FIG. 1.
Figure 13:
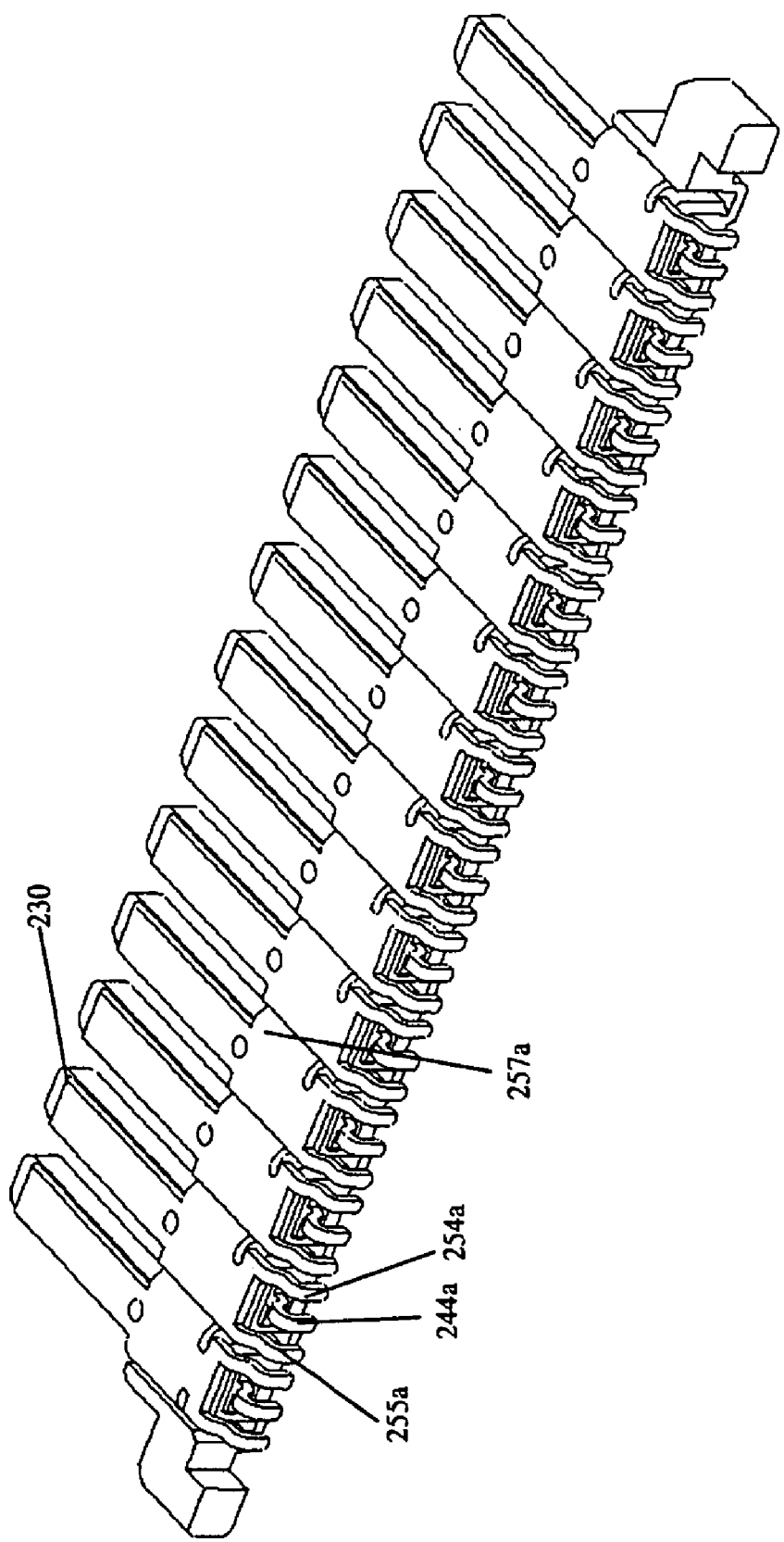
FIG. 13 is a perspective view of the row of insulative posts of FIG. 11, showing the ground conductors of FIG. 12a and the signal conductors of FIG. 12b disposed therein.

In the embodiment of the invention illustrated in FIGS. 12a–13, the first contact end 241 of the signal conductors 240 includes a contact tail 244 having a contact pad 244a that is adapted for soldering to the printed circuit board. The second contact end 243 of the signal conductors 240 is configured as a blade to connect to the dual beam structure 134 of the corresponding signal conductors 124 of the first electrical connector 100. The first contact end 251 of the ground conductors 250 includes at least two contact tails 254, 255 having contact pads 254a, 255a, respectively, that are adapted for soldering to the printed circuit board. The second contact end 253 of the ground conductors 250 is configured as a blade to connect to the opposing contacting members 145, 146 of the corresponding shield strips 126 of the first electrical connector 100. While the drawings show contact tails adapted for soldering, it should be apparent to one of ordinary skill in the art that the first contact end 241 of the signal conductors 240 and the first contact end 251 of the ground conductors 250 may take any known form (e.g., press-fit contacts, pressure-mount contacts, paste-in-hole solder attachment) for connecting to a printed circuit board.

Still referring to FIG. 12a, the intermediate portion 252 of each ground conductor 250 has a surface 252s with a first edge 257a and a second edge 257b, at least one of the first edge 257a or the second edge 257b being bent. In the preferred embodiment, the first edge 257a is bent substantially perpendicular to the surface 252s of the ground conductor 250. Note, however, that for one of the end ground conductors 250, both the first edge 257a and the second edge 157b are preferably bent (see FIG. 13, where the left-most ground conductor is shown with both edges bent). As will be described below in greater detail, the design of the ground conductors 250 is significant in addressing the problems of cross-talk, impedance and attenuation mismatch set forth in the Background of the Invention section.

FIG. 13 shows a row of insulative posts 230, with signal conductors 240 and ground conductors 250 disposed therein. The signal conductors 240 are disposed along the first side 231 of the insulative posts 230 and the ground conductors 250 are disposed along the second side 232 of the insulative posts 230. Because the first and second sides 231, 232 of the insulative post 230 are positioned on opposite sides, this ensures that the signal conductor 240 and the ground conductor 250 are electrically isolated from one another. Note that the insulative posts 230 are provided with slits configured to receive bent first edge 257a (and/or the bent second edge 257b) of the ground conductors 250 when the ground conductors are inserted into the insulative posts 230 through the holes 234.

When the signal conductors 240 and the ground conductors 250 are disposed along the insulative posts 230, the bent first edge 257a of each ground conductor 250 is directed toward the corresponding signal conductor 240. In the embodiment of the invention shown, the contact pads 244a of the signal conductors 240 and the contact pads 254a, 255a of the ground conductors 250 are aligned along a line for attachment to a printed circuit board, such as the printed circuit board 50 of FIG. 14. One way to provide alignment of the contact pads 244a, 254a, 255a along a line is to provide the first contact ends 241 of the signal conductors 240 with a curved portion 248 (see FIG. 12b) having a predetermined curvature. The first contact ends 251 of the ground conductors 250 may also be provided with a curved portion having a predetermined curvature.

The second electrical connector 200 may also be configured to carry differential pairs of signals. In this case, a second plurality of signal conductors is preferably provided to each row of the insulative posts 230. And the surface 252s of each ground conductor is preferably wider than a distance between the signals of a corresponding differential pair to provide sufficient shielding.

For exemplary purposes only, the insulative housing 210 of the second electrical connector 200 is illustrated to receive ten rows of insulative posts 230 having signal conductors 240 and ground conductors 250 disposed thereon. Each row has fourteen insulative posts 230. These ten rows with each row having fourteen insulative posts 230 correspond to the ten wafers 120 of the first electrical connector 100, with each wafer 120 having fourteen signal conductors 124 and corresponding shield strips 126. It should be apparent to one of ordinary skill in the art that the number of wafers 120, the number of signal conductors 124 and shield strips 126, the number of rows of insulative posts 230, and the number of signal conductors 240 and ground conductors 250 may be varied as desired. It should also be apparent that while the figures show the insulative posts 230 to be insertable into openings in the insulative housing 210, the insulative posts 230 may also be integrally formed with the insulative housing 210 by molding.

Referring now to FIG. 14, there is shown a portion of the printed circuit board 50 to which an electrical connector in accordance with the present invention, such as the first electrical connector 100 and/or the second electrical connector 200, can be connected. FIG. 14 is an embodiment of a layout of surface mounting pads on the printed circuit board 50. Signal conductor surface mounting pads 52 and ground conductor surface mounting pads 53 are aligned in rows corresponding to the contact tails of the signal conductors and the ground conductors of the electrical connector. Illustrated on each mounting pad is a circle 52a, 53a which indicates where a conductive via is preferably located underneath the corresponding surface mounting pad. Note that the conductive vias would not be visible due to the surface mounting pads in the preferred embodiment. Here, only five rows of surface mounting pads are shown for exemplary purposes.

The signal conductor surface mounting pads 52 are generally configured in an I-shape while the ground conductor surface mounting pads 53 are also generally configured in an I-shape, but with an end 54 proximal to the circle 53a directed toward the adjacent signal conductor surface mounting pad 52. Also, as shown in FIG. 14, for ground conductor surface mounting pads that are adjacent to one another, indicated by reference number 55, the ground conductor surface mounting pads may be connected to one another by a bridging portion 57. These bridging portions 57 provide adjacent ground conductor surface mounting pads 55 with a general H-shaped configuration.

As mentioned above, under the surface mounting pads 52, 53 are conductive vias. That is, under the signal conductor surface mounting pads 52 are signal conductor connecting conductive vias and under the ground conductor surface mounting pads 53 are ground conductor connecting conductive vias. As is known in the art, printed circuit boards are generally formed of multiple layers of dielectric substrates with conductive traces or planes formed on one or more of the dielectric layers. Vias generally extend between layers of the multi-layer printed circuit board. Vias which extend through all layers of a multi-layer printed circuit board are sometimes referred to as through-holes. The vias are usually formed after the layers of substrates are formed into a printed circuit board. Conductive vias intersect conductive traces on different layers. Conductive vias also interconnect components mounted on the printed circuit board to conductive traces on inner layers of the printed circuit board.

Between adjacent rows of FIG. 14, there would be routing channels (not shown) in the printed circuit board 50. Also, routing channels may be provided between adjacent repeating patterns along the row of ground conductor connecting conductive via—signal conductor connecting conductive via—ground conductor connecting conductive via.

Note that a distance between a signal conductor connecting conductive via and an adjacent ground conductor connecting conductive via of a row is less than a distance between adjacent rows of the conductive vias. In addition, for each row of conductive vias, a distance between a signal conductor connecting conductive via and an adjacent ground conductor connecting conductive via on one side is preferably similar to a distance between the signal conductor connecting conductive via and an adjacent ground conductor connecting conductive via on the other side. Because of the configurations of the surface mounting pads and the relative positions of the conductive vias, cross-talk is minimized.

Figure 15A:
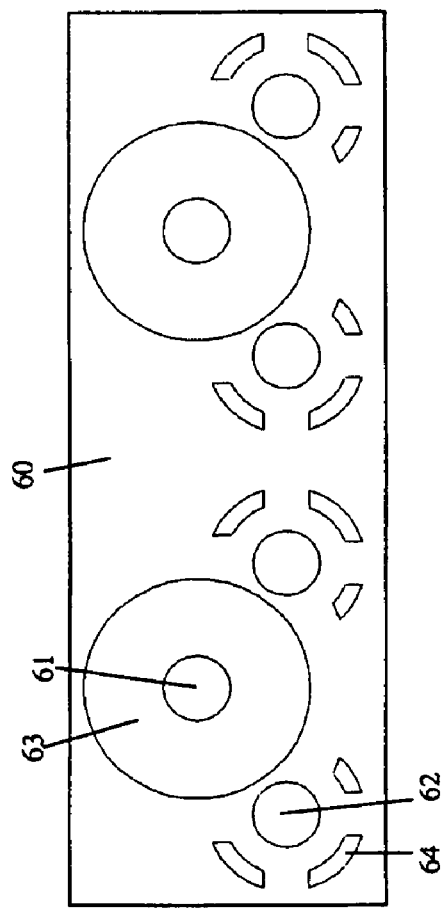
FIG. 15a shows a portion of a ground plane of the printed circuit board of FIG. 14.

FIG. 15a shows a portion of a ground plane 60 formed on one of the dielectric layers of the printed circuit board 50. Typically, the printed circuit board 50 will have more than one ground plane. The ground plane 60 has extending therethrough signal conductor connecting conductive vias 61 and adjacent ground conductor connecting conductive vias 62. For each signal conductor connecting conductive via 61, there is provided an area 63 surrounding the signal conductor connecting conductive via 61 that is free of the ground plane layer 60. This free area is sometimes referred to as an "antipad". For each ground conductor connecting conductive via 62, there is provided at least one discrete area 64 adjacent the ground conductor connecting conductive via 62 that is free of the ground plane layer 60. In the embodiment illustrated in FIG. 15a, there are three such antipads 64 adjacent each ground conductor connecting conductive via 62, and the antipad 63 surrounding the signal conductor connecting conductive via 61 is circular in shape.

Figure 15B:
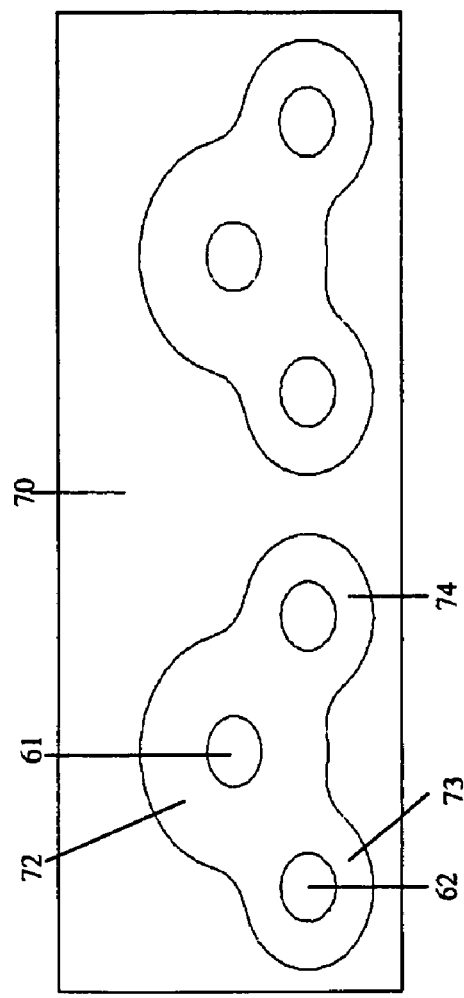
FIG. 15b shows a portion of a power voltage plane of the printed circuit board of FIG. 14.

FIG. 15b shows a portion of a power voltage plane 70 formed on one of the dielectric layers of the printed circuit board 50. Typically, the printed circuit board 50 will have more than one power voltage plane. The power voltage plane 70 has extending therethrough signal conductor connecting conductive vias 61 and adjacent ground conductor connecting conductive vias 62. For the signal conductor connecting conductive via 61 and its adjacent ground conductor connecting conductive vias 62, there is provided an area 72 surrounding the signal conductor connecting conductive via 61 that is free of the power voltage plane layer 70 and areas 73, 74 surrounding the ground conductor connecting conductive vias 62 that are free of the power voltage plane layer 70. In the embodiment illustrated in FIG. 15b, each of the antipads 72, 73, 74 are circular in shape and connected to one another.

From tests performed, it has been demonstrated that this configuration of the conductive vias and their respective antipads provide desirable electrical as well as thermal characteristics. However, it should be apparent to one of ordinary skill in the art that other configurations may be utilized.

Figure 16:
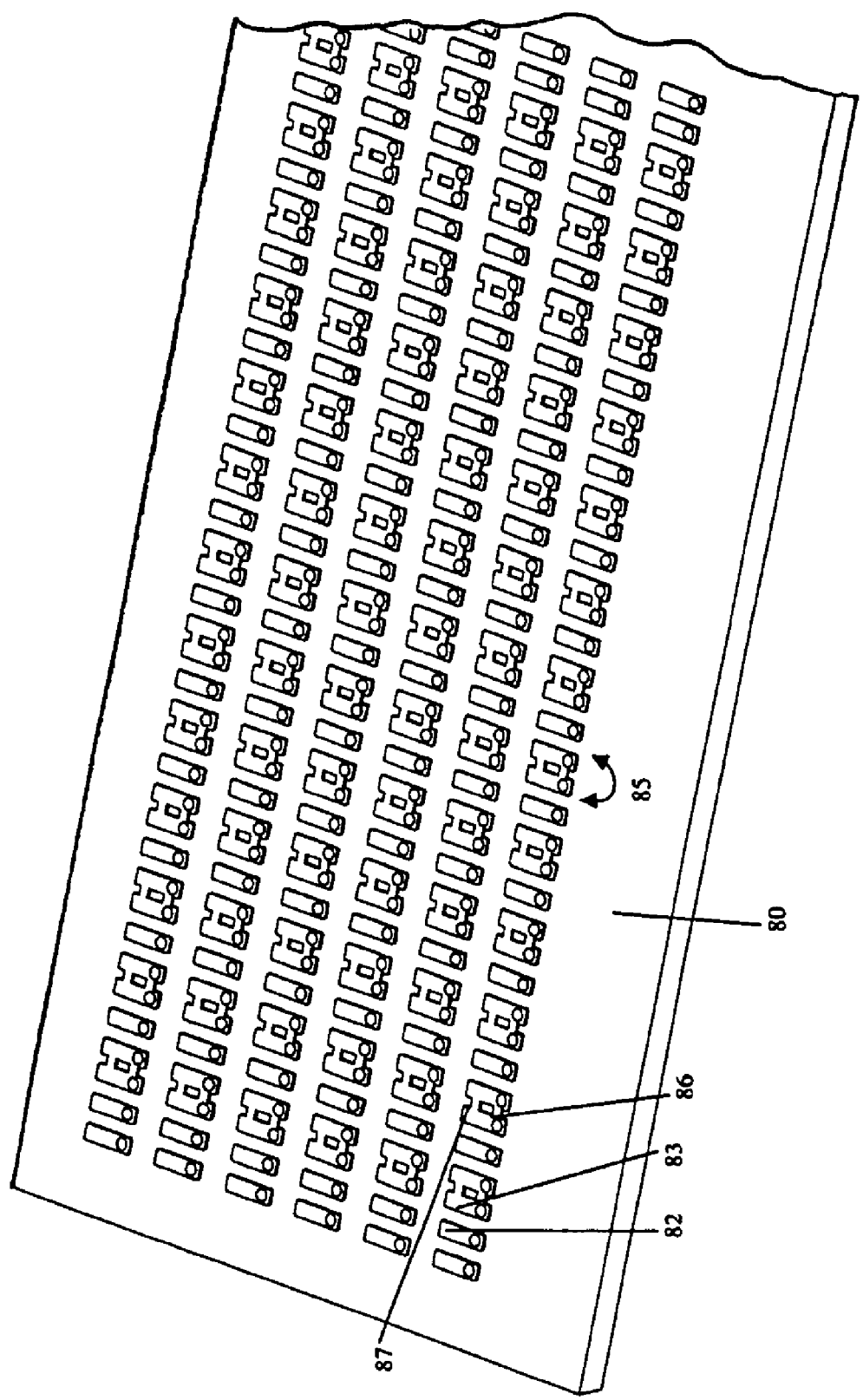
FIG. 16 is a perspective view of a portion of a printed circuit board, which is an alternative embodiment of the printed circuit board of FIG. 14.

Referring now to FIG. 16, there is shown a perspective view of a portion of a printed circuit board 80, which is an alternative embodiment of the printed circuit board 50 of FIG. 14. Signal conductor surface mounting pads 82 and ground conductor surface mounting pads 83 are aligned in rows corresponding to the contact tails of the signal conductors and the ground conductors of the electrical connector. However, unlike the mounting pads 52, 53 of FIG. 14, both the signal conductor surface mounting pads 82 and the ground conductor surface mounting pads 83 of FIG. 16 are configured in a straight I-shape. Also, for ground conductor surface mounting pads that are adjacent to one another, indicated by reference number 85, the ground conductor surface mounting pads may be connected to one another by two bridging portions 86, 87. These bridging portions 86, 87 provide adjacent ground conductor surface mounting pads 85 with a general H-shaped configuration. Further, the conductive vias under each row of the surface mounting pads of the printed circuit board 80 are preferably aligned along a line.

Figure 17:
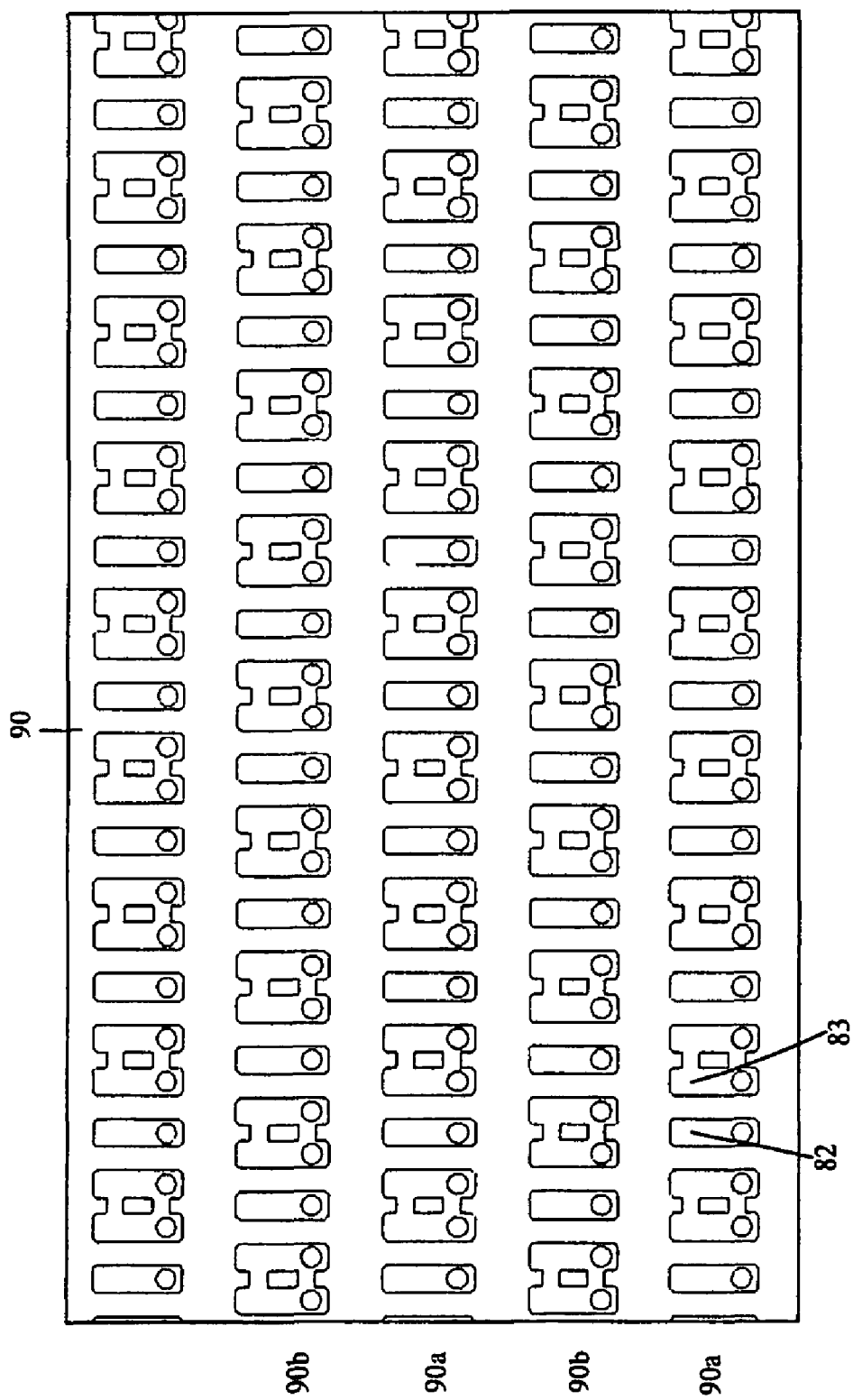
FIG. 17 is a top view of a portion of a printed circuit board, which is still another embodiment of the printed circuit board of FIG. 14.

FIG. 17 shows a top view of a portion of a printed circuit board 90, which is still another embodiment of the printed circuit board 50 of FIG. 14. The printed circuit board 90 has interleaved first and second rows 90a, 90b. Each first row 90a is similar to a row of surface mounting pads of FIG. 16. Each second row 90b is also similar to a row of surface mounting pads of FIG. 16; however, it is as if the row of surface mounting pads of FIG. 16 has shifted to either the right or the left relative to the first row 90a. In the illustrated embodiment of FIG. 17, the second row 90b has moved to the right relative to the first row 90a so that each signal conductor connecting conductive via of the first and second rows 90a, 90b has a ground conductor connecting conductive via adjacent on at least three sides.

Note that for the printed circuit board 90, the distance between adjacent rows of surface mounting pads (i.e., distance between rows 90a and 90b) can be less than the distance between adjacent rows of surface mounting pads of FIG. 16, because each signal conductor surface mounting pad 82 has ground conductor surface mounting pads 83 on either side in the same row, as well as ground conductor surface mounting pads directly across from it in adjacent rows.

The design of the electrical connector assembly 10 provides significant benefits. First, the design provides a connector that is modular in structure. That is, the number of signals desired to be provided by the connector can be varied simply by adding or subtracting the number of wafers and rows of insulative posts. Further, for each wafer or row of insulative posts, the number of signal conductors and the number of shield strips/ground conductors can be varied with minimal modifications to the design and manufacturing processes. Therefore, meaningful cost and resource advantages are realizable due to the modular design of the electrical connector assembly 10.

Significant electrical signal benefits are also realized by the electrical connector assembly 10. For example, electrical analyses have demonstrated significant reduction in cross-talk. Also, electrical analyses have demonstrated minimal attenuation and impedance mismatch characteristics. Furthermore, the electrical connector assembly 10, in electrical analyses, provides high data rates (greater than 6 Gb/s). Therefore, the electrical connector assembly 10 of the present invention appears to provide significant advantages over existing connector assemblies.

Having described the preferred and alternative embodiments of the invention, it will now become apparent to one of ordinary skill in the art that other embodiments incorporating their concepts may be used.

It is felt therefore that these embodiments should not be limited to disclosed embodiments but rather should be limited only by the spirit and scope of the appended claims.

All publications and references cited herein are expressly incorporated herein by reference in their entirety.

What is claimed is:

1. A printed circuit board having a surface providing a mating interface to which is electrically connected an electrical connector having signal conductors and ground conductors, the printed circuit board comprising:
   a plurality of stacked dielectric layers, with a conductor disposed on at least one of the plurality of dielectric layers;
   the mating interface including:
      a plurality of conductive vias aligned in a plurality of rows, the plurality of conductive vias extending through at least a portion of the plurality of dielectric layers, at least one of the plurality of conductive vias intersecting the conductor; and
      the plurality of conductive vias including signal conductor conductive vias and ground conductor conductive vias,
      for each of the plurality of rows of the conductive vias, the conductive vias are positioned relative to one another so that for each signal conductor conductive via, there are ground conductor conductive vias adjacent either side of the signal conductor connecting conductive via to form a repeating pattern along the row of conductive vias, wherein the repeating pattern comprises ground conductor conductive via, signal conductor conductive via, ground conductor conductive via.

2. The printed circuit board of claim 1, wherein a distance between a signal conductor connecting conductive via and an adjacent ground conductor connecting conductive via of a row is less than a distance between adjacent rows of the conductive vias.

3. The printed circuit board of claim 1, wherein for each of the plurality of rows of the conductive vias, a distance between a signal conductor connecting conductive via and an adjacent ground conductor connecting conductive via on one side is similar to a distance between the signal conductor connecting conductive via and an adjacent ground conductor connecting conductive via on the other side.

4. The printed circuit board of claim 1, which further comprises a surface mounting pad disposed on each of the plurality of conductive vias, the signal conductors and ground conductors of the electrical connector being electrically connected to the surface mounting pads.

5. The printed circuit board of claim 4, wherein the surface mounting pad corresponding to each signal conductor connecting conductive via is substantially configured in an I-shape and the surface mounting pads corresponding to adjacent ground conductor connecting conductive vias are substantially configured in an H-shape.

6. The printed circuit board of claim 1, which further comprises:
   a ground plane layer through which at least some of the plurality of conductive vias extend; and
   for each signal conductor connecting conductive via of the ground plane layer, there is provided an area surrounding the signal conductor connecting conductive via that is free of the ground plane layer.

7. The printed circuit board of claim 6, wherein for each ground conductor connecting conductive via of the ground plane layer, there is provided at least one discrete area adjacent the ground conductor connecting conductive via that is free of the ground plane layer.

8. The printed circuit board of claim 1, which further comprises:
   a power voltage plane layer through which at least some of the plurality of conductive vias extend; and
   for each signal conductor connecting conductive via and its corresponding adjacent ground conductor connecting conductive vias extending through the power voltage plane layer, there is provided an area surrounding the conductive vias that is free of the power voltage plane layer.

9. A printed circuit board having a surface providing a mating interface to which is electrically connected an electrical connector having signal conductors and ground conductors, each signal conductor having a contact tail, with the signal conductor contact tails disposed in a plurality of rows of signal conductor contact tails, and each ground conductor having at least one pair of contact tails positioned along a row of the plurality of rows of signal conductor contact tails, with each signal conductor contact tail being positioned between ground conductor contact tails of a pair, the printed circuit board comprising:
   a plurality of stacked dielectric layers;
   the mating interface including:
      a plurality of conductive pads aligned in a plurality of rows of conductive pads;
      the plurality of conductive pads including signal conductor conductive pads and ground conductor conductive pads; and
      for each of the plurality of rows of the conductive pads, each signal conductor conductive pad has corresponding ground conductor conductive pads adjacent either side of the signal conductor conductive pad so as to form a repeating pattern along the row of ground conductor conductive pad—signal conductor conductive pad—ground conductor conductive pad; and
      wherein each signal conductor contact tail aligns with a signal conductor conductive pad and each ground conductor contact tail aligns with a ground conductor conductive pad.

10. The printed circuit board of claim 9, further comprising a plurality of signal conductor conductive vias, each signal conductor conductive via being coupled to a signal conductor conductive pad of the plurality of conductive pads and a plurality of ground conductor conductive vias, each ground conductor conductive via being coupled to a ground conductor conductive pad of the plurality of conductive pads; and
   wherein a distance between a signal conductor conductive via and an adjacent ground conductor conductive via coupled to conductive pads in the same row of the plurality of rows of conductive pads is less than a distance between signal conductor conductive vias coupled to conductive pads in adjacent rows of the plurality of rows of conductive pads.

11. The printed circuit board of claim 10, wherein the plurality of signal conductor conductive vias are disposed in rows and for each of the plurality of rows of signal conductor conductive vias, a distance between a signal conductor conductive via and an adjacent ground conductor conductive via on one side is similar to a distance between the signal conductor conductive via and an adjacent ground conductor conductive via on the other side.

12. The printed circuit board of claim 10, wherein each of the plurality of conductive pads comprises a surface mounting pad and the printed circuit board comprises a plurality of conductive vias, each disposed below a surface mount pad.

13. The printed circuit board of claim 12, wherein the surface mounting pad corresponding to each signal conductor conductive via is substantially configured in an I-shape and the surface mounting pads corresponding to adjacent ground conductor conductive vias are substantially configured in an H-shape.

14. The printed circuit board of claim 9, further comprising a plurality of signal conductor conductive vias, each signal conductor conductive via being coupled to a signal conductor conductive pad of the plurality of conductive pads and a plurality of ground conductor conductive vias, each ground conductor conductive via being coupled to a ground conductor conductive pad of the plurality of conductive pads; and which further comprises:
   a ground plane layer through which at least some of the plurality of conductive vias extend; and
   for each signal conductor conductive via of the ground plane layer, there is provided an area surrounding the signal conductor conductive via that is free of the ground plane layer.

15. The printed circuit board of claim 14, wherein for each ground conductor conductive via of the ground plane layer, there is provided at least one discrete area adjacent the ground conductor conductive via that is free of the ground plane layer.

16. The printed circuit board of claim 9, further comprising a plurality of signal conductor conductive vias, each signal conductor conductive via being coupled to a signal conductor conductive pad of the plurality of conductive pads and a plurality of ground conductor conductive vias, each ground conductor conductive via being coupled to a ground conductor conductive pad of the plurality of conductive pads; and which further comprises:
   a power voltage plane layer through which at least some of the plurality of conductive vias extend; and
   for each signal conductor conductive via and its corresponding adjacent ground conductor conductive vias extending through the power voltage plane layer, there is provided an area surrounding the conductive vias that is free of the power voltage plane layer.

17. A printed circuit board having a surface providing a mating interface to which is electrically connected an electrical connector having signal conductors and ground conductors, the printed circuit board comprising:
   a plurality of stacked dielectric layers;
   the mating interface including:
   a plurality of conductive vias aligned in a plurality of interleaved first and second rows, the plurality of conductive vias extending through at least a portion of the plurality of dielectric layers;
   the plurality of conductive vias including signal conductor connecting conductive vias and ground conductor connecting conductive vias; and
   for each of the plurality of first rows, each signal conductor connecting conductive via has corresponding ground conductor connecting conductive vias adjacent either side of the signal conductor connecting conductive via so as to form a repeating pattern along the row of ground conductor connecting conductive via—signal conductor connecting conductive via—ground conductor connecting conductive via;
   for each of the plurality of second rows, each signal conductor connecting conductive via has corresponding ground conductor connecting conductive vias adjacent either side of the signal conductor connecting conductive via so as to form a repeating pattern along the row of ground conductor connecting conductive via—signal conductor connecting conductive via—ground conductor connecting conductive via; and
   the positions of the signal conductor connecting conductive vias in the first rows relative to the positions of the signal conductor connecting conductive vias in the second rows are offset so that each signal conductor connecting conductive via in the first and second rows has a ground conductor connecting conductive via adjacent at least three sides.

18. The printed circuit board of claim 17, wherein for each of the plurality of first and second rows of the conductive vias, a distance between a signal conductor connecting conductive via and an adjacent ground conductor connecting conductive via on one side is similar to a distance between the signal conductor connecting conductive via and an adjacent ground conductor connecting conductive via on the other side.

19. The printed circuit board of claim 17, which further comprises a surface mounting pad disposed on each of the plurality of conductive vias, the signal conductors and ground conductors of the electrical connector being electrically connected to the surface mounting pads.

20. A printed circuit board having a surface providing a mating interface to which is electrically connected an electrical connector having signal conductors and ground conductors, the printed circuit board comprising:
   a plurality of stacked dielectric layers, with a conductor disposed on at least one of the plurality of dielectric layers;
   the mating interface including:
   a plurality of conductive vias aligned in a plurality of rows, the plurality of conductive vias extending through at least a portion of the plurality of dielectric layers, at least one of the plurality of conductive vias intersecting the conductor;
   the plurality of conductive vias including signal conductor connecting conductive vias and ground conductor connecting conductive vias;
   for each of the plurality of rows of the conductive vias, there are at least twice as many ground conductor connecting conductive vias as signal conductor connecting conductive vias and the conductive vias are positioned relative to one another so that for each signal conductor connecting conductive via, there are ground conductor connecting conductive vias adjacent either side of the signal conductor connecting conductive via; and
   a surface mounting pad disposed on each of the plurality of conductive vias, the signal conductors and ground conductors of the electrical connector being electrically connected to the surface mounting pads,
   wherein the surface mounting pad corresponding to each signal conductor connecting conductive via is substantially configured in an I-shape and the surface mounting pads corresponding to adjacent ground conductor connecting conductive vias are substantially configured in an H-shape.

* * * * *